(12) United States Patent
Hsieh et al.

(10) Patent No.: US 10,165,682 B2
(45) Date of Patent: Dec. 25, 2018

(54) OPENING IN THE PAD FOR BONDING INTEGRATED PASSIVE DEVICE IN INFO PACKAGE

(71) Applicant: Taiwan Semiconductor Manufacturing Company, Ltd., Hsin-Chu (TW)

(72) Inventors: Cheng-Hsien Hsieh, Hsin-Chu (TW); Chi-Hsi Wu, Hsin-Chu (TW); Chen-Hua Yu, Hsin-Chu (TW); Der-Chyang Yeh, Hsin-Chu (TW); Hsien-Wei Chen, Hsin-Chu (TW); Li-Han Hsu, Hsin-Chu (TW); Wei-Cheng Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 269 days.

(21) Appl. No.: 14/979,954

(22) Filed: Dec. 28, 2015

(65) Prior Publication Data
US 2017/0188458 A1 Jun. 29, 2017

(51) Int. Cl.
| | |
|---|---|
| H05K 1/11 | (2006.01) |
| H01L 23/00 | (2006.01) |
| H05K 1/18 | (2006.01) |
| H05K 1/02 | (2006.01) |

(52) U.S. Cl.
CPC .............. *H05K 1/115* (2013.01); *H01L 24/19* (2013.01); *H01L 24/20* (2013.01); *H05K 1/111* (2013.01); *H05K 1/113* (2013.01); *H05K 1/181* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/73265* (2013.01); *H01L 2224/73267* (2013.01); *H01L 2924/15311* (2013.01); *H01L 2924/181* (2013.01); *H05K 1/0271* (2013.01); *H05K 2201/0183* (2013.01); *H05K 2201/068* (2013.01);
(Continued)

(58) Field of Classification Search
CPC ..... H01L 23/48; H01L 23/488; H01L 23/522; H05K 1/115; H05K 1/181; H05K 1/111
See application file for complete search history.

(56) References Cited

U.S. PATENT DOCUMENTS

| | | | |
|---|---|---|---|
| 8,361,842 B2 | 1/2013 | Yu et al. | |
| 8,647,974 B2 | 2/2014 | Topacio et al. | |
| 8,680,647 B2 | 3/2014 | Yu et al. | |

(Continued)

FOREIGN PATENT DOCUMENTS

| | | |
|---|---|---|
| CN | 103460379 A | 12/2013 |
| CN | 104851841 A | 8/2015 |

(Continued)

*Primary Examiner* — Nathan Milakovich
(74) *Attorney, Agent, or Firm* — Slater Matsil, LLP (57) ABSTRACT

A package includes a conductive pad, with a plurality of openings penetrating through the conductive pad. A dielectric layer encircles the conductive pad. The dielectric layer has portions filling the plurality of openings. An Under-Bump Metallurgy (UBM) includes a via portion extending into the dielectric layer to contact the conductive pad. A solder region is overlying and contacting the UBM. An integrated passive device is bonded to the UBM through the solder region.

10 Claims, 7 Drawing Sheets

(52) U.S. Cl.
CPC ............... *H05K 2201/0969* (2013.01); *H05K 2201/09136* (2013.01); *H05K 2201/09381* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,980,691 B2 | 3/2015 | Lin | |
| 9,349,665 B2 * | 5/2016 | Chen | H01L 24/05 |
| 9,589,938 B2 | 3/2017 | Chen et al. | |
| 9,793,231 B2 * | 10/2017 | Chen | H01L 24/13 |
| 2007/0290343 A1 * | 12/2007 | Harada | H01L 24/03 |
| | | | 257/737 |
| 2010/0109052 A1 | 5/2010 | Nakajima et al. | |
| 2010/0140736 A1 | 6/2010 | Lin et al. | |
| 2010/0155942 A1 | 6/2010 | Takemura et al. | |
| 2011/0291288 A1 | 12/2011 | Wu et al. | |
| 2012/0025394 A1 | 2/2012 | Hirano et al. | |
| 2012/0241985 A1 | 9/2012 | Topacio et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0077356 A1 * | 3/2014 | Chen | H01L 23/3192 |
| | | | 257/737 |
| 2014/0124949 A1 | 5/2014 | Paek et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0001708 A1 * | 1/2015 | Lin | H01L 23/49811 |
| | | | 257/737 |
| 2015/0228580 A1 | 8/2015 | Chen et al. | |
| 2015/0348877 A1 | 12/2015 | Huang et al. | |
| 2016/0190082 A1 * | 6/2016 | Tsai | H05K 1/111 |
| | | | 257/737 |

FOREIGN PATENT DOCUMENTS

| | | |
|---|---|---|
| JP | 2010267944 A | 11/2010 |
| KR | 20140012689 A | 2/2014 |
| KR | 20150095551 A | 8/2015 |
| TW | 201434097 A | 9/2014 |
| TW | 201501223 A | 1/2015 |

\* cited by examiner

OPENING IN THE PAD FOR BONDING INTEGRATED PASSIVE DEVICE IN INFO PACKAGE

BACKGROUND

In the packaging of integrated circuits, there are various types of packaging methods and structures. For example, in a conventional Package-on-Package (POP) process, a top package is bonded to a bottom package. The top package and the bottom package may also have device dies packaged therein. By adopting the PoP process, the integration level of the packages is increased.

In an existing PoP process, the bottom package, which includes a device die bonded to a package substrate, is formed first. A molding compound is molded onto the package substrate, wherein the device die is molded in the molding compound. The package substrate further includes solder balls formed thereon, wherein the solder balls and the device die are on a same side of the package substrate. The solder balls are used for connecting the top package to the bottom package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package that may be used in a Package-on-Package (PoP) structure and the method of forming the same are provided in accordance with various exemplary embodiments. The intermediate stages of forming the InFO package are illustrated. Some variations of some embodiments are discussed. Throughout the various views and illustrative embodiments, like reference numbers are used to designate like elements.

Figure 1:
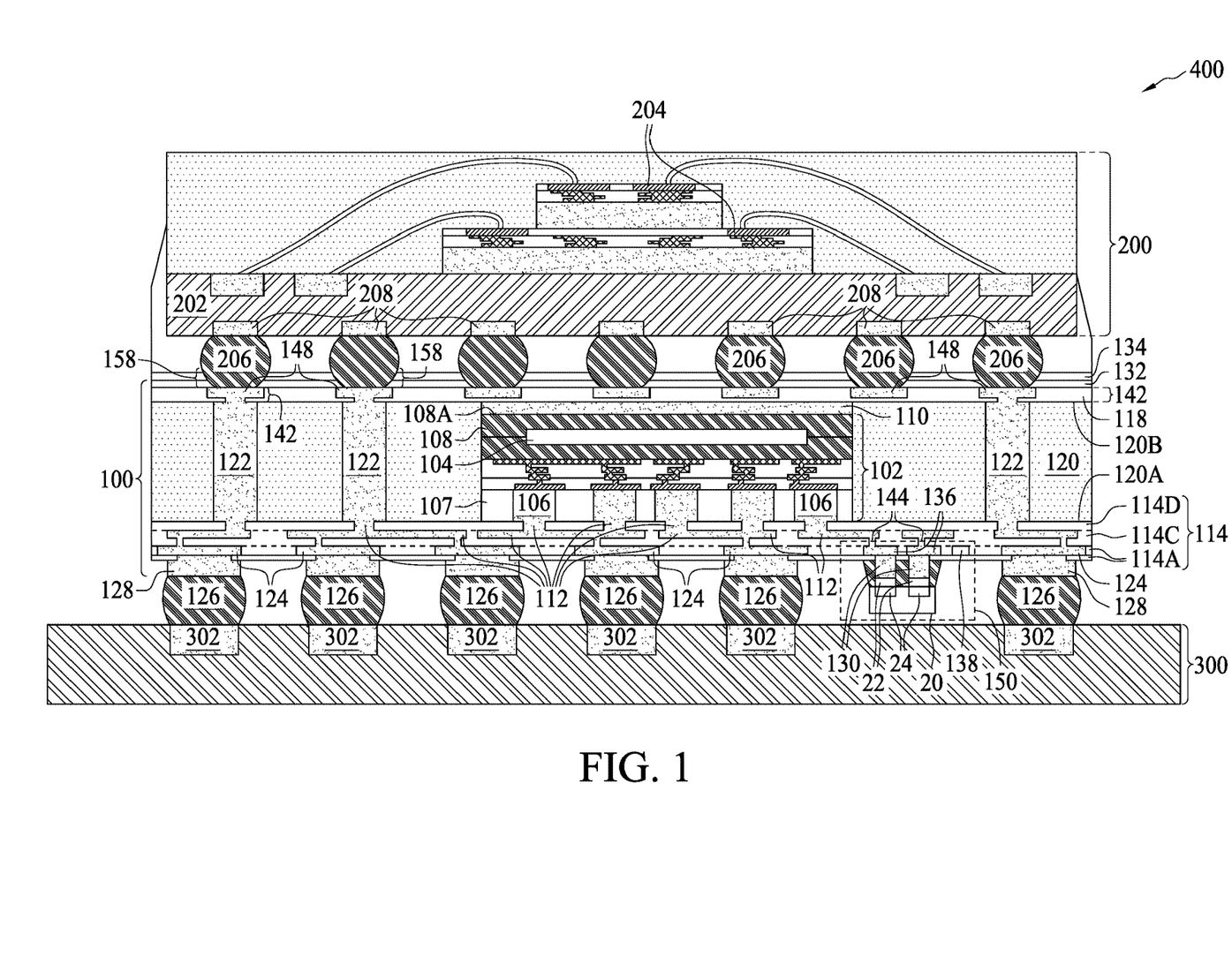
FIG. 1 illustrates a cross-sectional view of a package in accordance with some embodiments.

FIG. 1 illustrates a cross-sectional view of PoP package 400 in accordance with some embodiments of the present disclosure. PoP Package 400 includes bottom package 100 and top package 200 over and bonded to bottom package 100. Both bottom package 100 and top package 200 may be pre-formed, and are then bonded to each other to form a package-on-package structure. In accordance with some embodiments of the present disclosure, bottom package 100 includes device die 102, with the front side of device die 102 facing down and bonded to Redistribution Lines (RDLs) 112. Bottom package 100 may also include two or more device dies. Device die 102 may include semiconductor substrate 108, and integrated circuit devices (such as active devices, which may include transistors and/or diodes, for example) 104 at the front surface (the surface facing down) of semiconductor substrate 108. Device die 102 may be a logic device die such as a Central Processing Unit (CPU) die, a Micro Control Unit (MCU) die, a Graphic Processing Unit (GPU) die, a mobile application die, or the like.

Device die 102 is encapsulated (molded) in encapsulating material 120, which surrounds device die 102. Encapsulating material 120 may include a molding compound, a molding underfill, a resin, an epoxy, and/or the like. The bottom surface 120A of encapsulating material 120 may be leveled with the bottom end of device die 102. The top surface 120B of encapsulating material 120 may be level with or higher than back surface 108A of semiconductor substrate 108. In accordance with some embodiments of the present disclosure, back surface 108A of semiconductor substrate 108 is overlapped by die-attach film 110, which adheres device die 102 to the overlying dielectric layer(s) 118. Device die 102 may further include metal pillars 106 (which may include copper pillars) in contact with, and bonded to, RDLs 112. In accordance with some exemplary embodiments, metal pillars 106 are disposed in a dielectric layer 107, which may be a polymer layer. Dielectric layer 107 may be formed of polybenzoxazole (PBO), benzocyclobutene (BCB), polyimide, or the like in accordance with some exemplary embodiments.

Bottom package 100 may include Front-side RDLs 112 underlying device die 102 and encapsulating material 120. Throughout the description, the term "front-side RDL" indicates that the respective RDLs are on the front side of device die 102, and the term "back-side RDL" indicates that the respective RDLs are on the back side of device die 102. Front-side RDLs 112 are formed in dielectric layers 114 (including 114A, 114C, and 114D), and back-side RDLs 142 are formed in dielectric layer(s) 118. RDLs 112 and 142 may be formed of a metallic material(s) such as copper, aluminum, nickel, alloys thereof, or multi-layers thereof. In accordance with some embodiments of the present disclosure, dielectric layers 114 and 118 are formed of organic materials such as polymers, which may include PBO, BCB, polyimide, or the like. In accordance with alternative embodiments of the present disclosure, dielectric layers 114 and 118 are formed of inorganic materials such as silicon oxide, silicon nitride, silicon oxynitride, or the like.

Through-Vias 122 are encapsulated in, and hence penetrate through, encapsulating material 120. In accordance with some embodiments of the present disclosure, through-vias 122 have top surfaces level with the top surface of encapsulating material 120. Through-vias 122 may also have bottom surfaces level with the bottom surface of encapsulating material 120. Through-Vias 122 electrically couple/connect front-side RDLs 112 and device die 102 to back-side RDLs 142. Through-Vias 122 may also be in physical contact with some of front-side RDLs 112 and back-side RDLs 142.

Conductive pads 124 and 136, which are formed of a non-solder metallic material(s), are formed at the bottom surface of bottom package 100. In accordance with some embodiments of the present disclosure, conductive pads 124 and 136 are referred to as metal pads 124 and 136, although they may have the shapes (such as pillars) other than pads. Metal pads 124 and 136 (which may be parts of the respective RDLs) may be formed of a metallic material such as copper, aluminum, nickel, palladium, gold, or an alloy thereof.

Under-Bump Metallurgies (UBMs) 128 and 130 are formed at the bottom surface of package 100. UBMs 128 and 130 are such named since they are under (when package 100 is viewed upside down) solder regions 126, which are sometimes referred to as solder bumps.

Solder regions 126 are used to bond metal pads 124 of bottom package 100 to package component 300. Package component 300 may include a Printed Circuit Board (PCB), a package, an interposer, or another type of package component. Although not illustrated, package component 300 may also include conductive interconnections such as pads at the bottom surface of package component 300, and conductive traces, vias, conductive pipes, or the like built inside package component 300. The conductive interconnections are used to connect conductive pads 302 on the top surface of package component 300 to the conductive features at the bottom surface of package component 300. Solder regions 126 may be joined to conductive pads 302 in package component 300.

The back-side RDLs 142 include some metal pads 148. In accordance with some embodiments, metal pads 148 are in the topmost RDL layer in package component 100. Dielectric layer 132 is formed over metal pads 148 and dielectric layer(s) 118. Dielectric layer 132 may be formed of a polymer such as PBO or other organic or inorganic materials. Throughout the description, dielectric layer 132 is referred to as polymer layer 132 although it may also be formed of a dielectric material other than polymer. In accordance with some embodiments, tape 134 is over and attached to dielectric layer 132. Tape 134 is used to provide protection and reinforcement to the underlying structure such as polymer layer 132, dielectric layer(s) 118, and RDLs 142. Tape 134 may be pre-formed, and the pre-formed tape 134 is adhered onto dielectric layer 132. In accordance with alternative embodiments, tape 134 is not formed, and polymer layer 132 is the top dielectric layer of package component 100.

Openings 158 (occupied by solder regions 206) are formed in polymer layer 132 and tape 134, and metal pads 148 are exposed to openings 158. Solder regions 206 have their bottom portions filling openings 158, with solder regions 206 in contact with metal pads 148.

Top package 200 is bonded to bottom package 100 through solder regions 206. In accordance with some embodiments of the present disclosure, top package 200 includes package substrate 202 and device die(s) 204, which are bonded to package substrate 202. The bonding of device dies 204 to package substrate 202 may be achieved through wire bonding, flip-chip bonding, or the like. Furthermore, solder regions 206 are in contact with metal pads 208 at the bottom surface of package component 200. Accordingly, solder regions 206 have their top surfaces in contact with metal pads 208 and bottom surfaces in contact with the top surfaces of metal pads 148.

Under package 100 resides Integrated Passive Device (IPD) 20, which is a discrete passive device that is not formed in a same die in which active devices such as transistors and diodes are formed. Accordingly, IPD 20 may be free from active devices built therein. IPD 20 is also sometimes referred to as a Surface Mount Device (SMD) since the passive device is mounted on the surface of other package components, rather than being built in the same device die in which active devices are formed. In accordance with some embodiments of the present disclosure, IPD 20 has two terminals 24, through which IPD 20 is electrically connected to UBMs 130. In accordance with alternative embodiments of the present disclosure, IPD 20 may include three or more terminals for electrical connection. In accordance with some embodiments of the present disclosure, IPD 20 is a capacitor, an inductor, a resistor, or another type of passive device. IPD 20 may be silicon based, wherein the passive device therein is formed starting from a semiconductor substrate such as silicon substrate. IPD 20 may also be ceramic based. IPD 20 may be used to tune the performance of the respective PoP structure.

Figure 2:
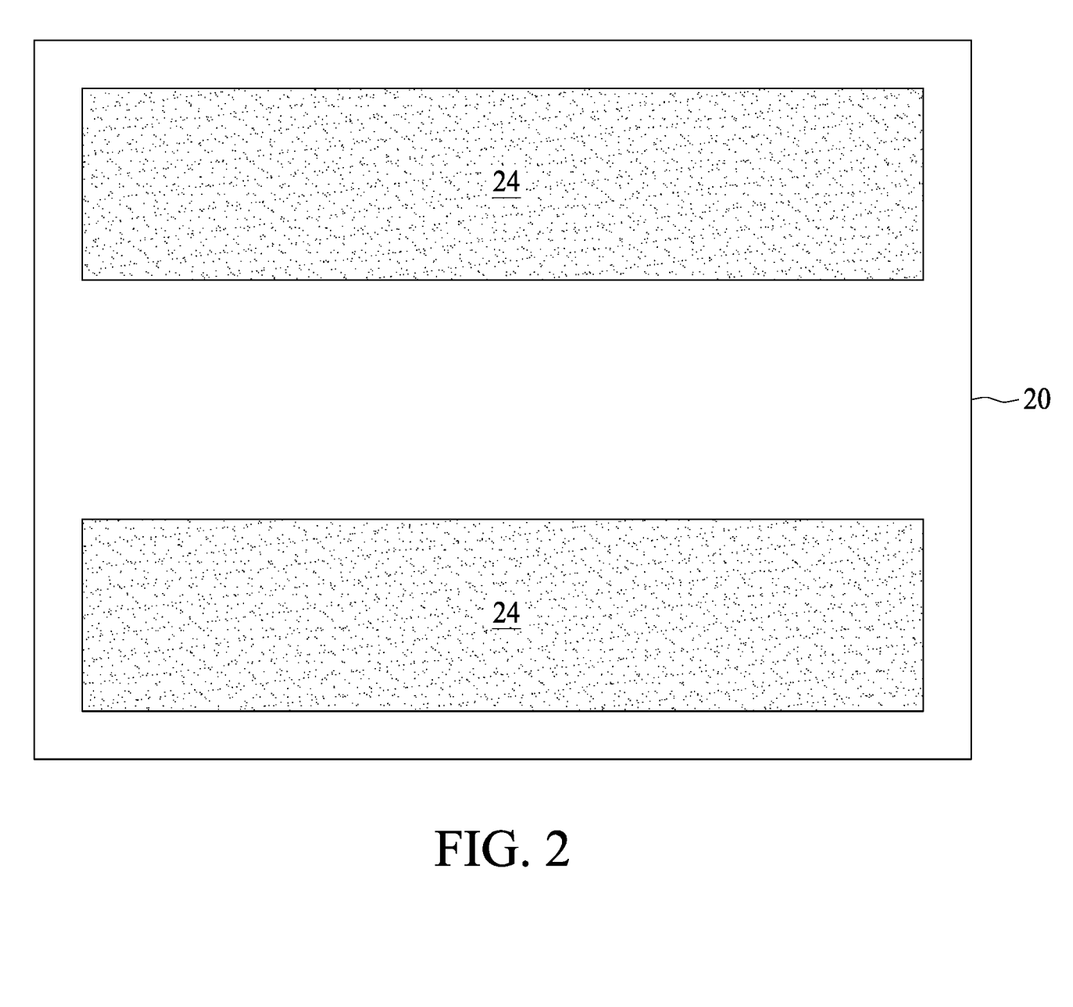
FIG. 2 illustrates a top view of an integrated passive device in accordance with some embodiments.

FIG. 2 illustrates a top view of IPD 20. In accordance with some embodiments of the present disclosure, IPD 20 includes terminals 24, which have strip shapes with lengths greater than the respective widths. Terminals 24 may be conductive pads such as metal pads, metal pillars, or the like. Terminals 24 may be parallel to each other, and may occupy a significant area (such as over 20 percent) of the top-view area of IPD 20.

Figure 3:
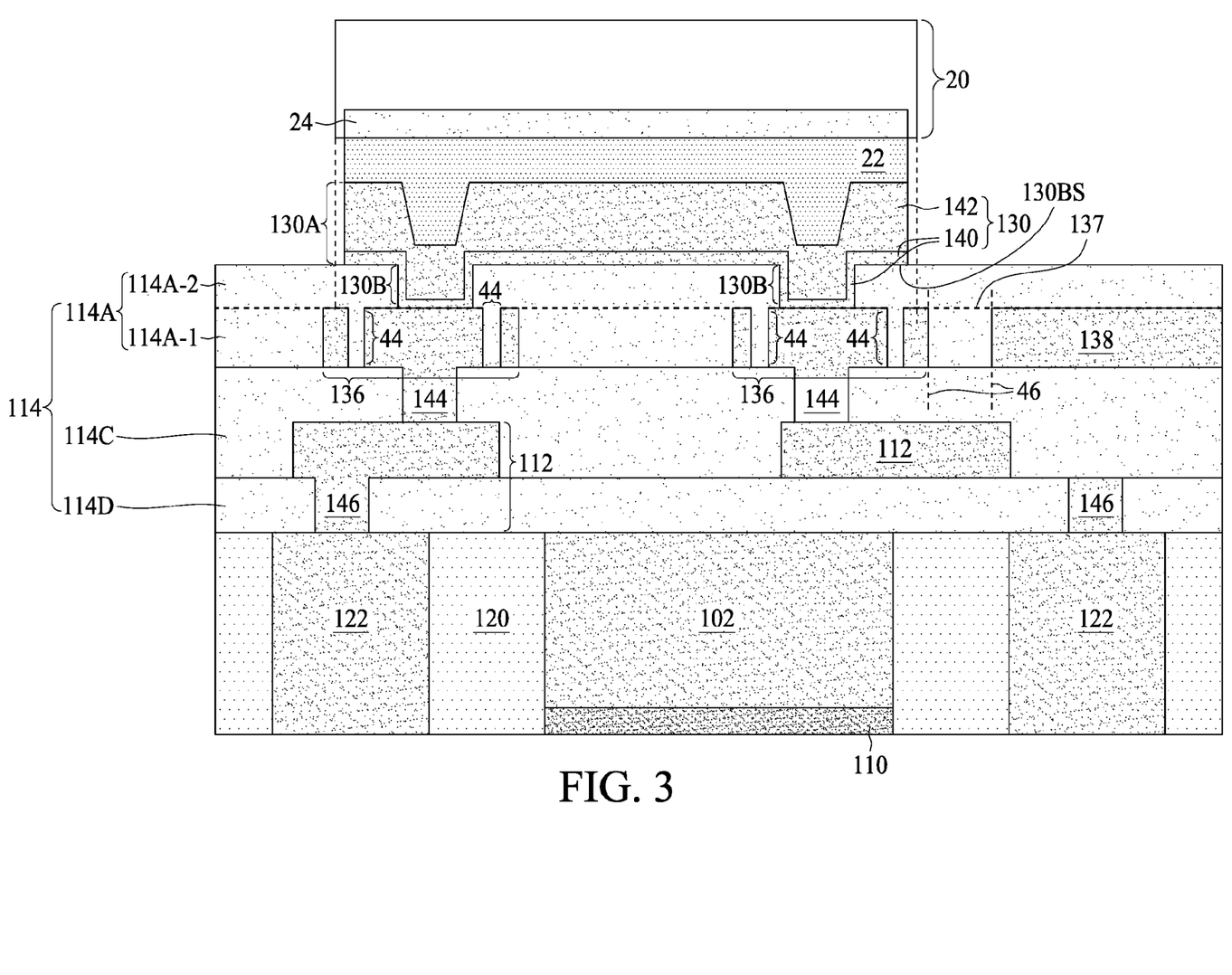
FIG. 3 illustrates a cross-sectional view of a portion of a package in accordance with some embodiments.

FIG. 3 illustrates a cross-sectional view of IPD 20, UBM 130, and metal pads 136 as shown in FIG. 1. It is appreciated that the features illustrated in FIG. 3 is turned upside-down with relative to the features shown in region 150 in FIG. 1. The cross-sectional view of IPD 20 as shown in FIG. 3 is made crossing one of UBMs 130 as shown in FIG. 1. Accordingly, FIG. 3 illustrates one UBM 130, although there may be two or more UBMs 130 in accordance with various embodiments.

Referring again to FIG. 3, UBMs 130 and the respective overlying terminals 24 may be interconnected through solder regions 22, which may be pre-formed on IPD 20 before IPD 20 is bonded to UBMs 130. After the reflow of solder regions 22, solder regions 22 are joined to UBMs 130. UBMs 130 may include titanium, nickel, copper, gold, palladium, alloys thereof, and/or multi-layers thereof. In accordance with some exemplary embodiments of the present disclosure, UBMs 130 include titanium layer 140, and copper layer 142 over titanium layer 140.

Dielectric layers 114 include dielectric layer 114A, which may be formed of an organic material such as polymer. UBMs 130 include pad portions 130A higher than polymer layer 114A, and via portions 130B extending into dielectric layer 114A. Via portions 130B are also in contact with the top surfaces of metal pads 136. In accordance with some embodiments, UBM via portions 130B and metal pads 136 are both in the same dielectric layer 114A, which is a homogeneous layer formed of a homogeneous dielectric material such as PBO, BCB, polyimide, or the like. In accordance with alternative embodiments, dielectric layer 114A includes dielectric layer 114A-1, and dielectric layer 114A-2 over dielectric layer 114A-1, with layers 114A-1 and 114A-2 being formed in different process steps. Accordingly, there may be (or may not be) a distinguishable interface 137 between dielectric layers 114A-1 and 114A-2.

A brief process for forming the structure in FIG. 3 is discussed as follows. First, through-vias 122 and device die 102 (also refer to FIG. 1) are encapsulated in encapsulating material 120, followed by a planarization such as Chemical Mechanical Polish (CMP) to planarize the top surfaces of through-vias 122, device die 102, and encapsulating material 120. Next, dielectric layer 114D is formed over, and contacting, encapsulating material 120 and through-vias 122. Openings (occupied by via portions 146 of RDLs 112) are then formed in dielectric layer 114D through a lithography process. RDLs 112 are then formed. RDLs 112 include trace portions higher than dielectric layer 114D and via portions 146 extending into dielectric layer 114D. Via portions 146 contact through-vias 122 and metal pads 106 (not shown in FIG. 3, refer to FIG. 1) in device die 102.

Next, dielectric layer 114C is formed. The top surface of dielectric layer 114C is higher than the top surfaces of RDLs 112. Openings are then formed in the top portion of dielectric 114C to expose the underlying RDLs 112, followed by the formation of RDLs including metal pads 136 and vias 144. Metal pads 136 are patterned with openings 44 therein, as shown in FIG. 4 through 7. The patterning of metal pads 136 is achieved through designing the mask (not shown) used for plating metal pads 136 with the pattern of openings 44. Next, dielectric layer 114A is formed. The top surface of dielectric layer 114A is higher than the top surface of metal pads 136. Openings 44 in metal pads 136 are filled with the material of dielectric layer 114A.

Next, dielectric layer 114A is patterned, for example, through light-exposure and development when dielectric layer 114A is formed of a photo sensitive material such as PBO. UBMs 130 are then formed, with UBM via portions 130B extending into the openings to contact metal pads 136, and pad portions 130A higher than dielectric layer 114A. In a subsequent step, IPD 20 is placed over UBMs 130, with the pre-formed solder regions 22 contacting UBMs 130. A reflow is then performed to bond IPD 20 to UBMs 130.

Each of dielectric layer 114A, 114C, and 114D may also be formed of a polymer such as PBO, BCB, or polyimide, wherein the formation includes dispensing and curing. Furthermore, some or all of dielectric layers 114A, 114C, and 114D may be formed of a photo sensitive material. Accordingly, the patterning of dielectric layers 114A, 114C, and 114D may be simplified as including a light exposure (using a lithography mask) and a development step. The formation of RDLs 112, RDLs 136/144, and UBMs 130 may include forming a blanket seed layer (not shown), and forming a patterned sacrificial mask (not shown), with portions of the seed layer exposed through the openings in the patterned sacrificial mask. The respective RDLs 112, RDLs 136/144, and UBMs 130 are formed through plating. The patterned sacrificial mask is then removed, followed by etching the portions of the seed layer covered by the removed patterned sacrificial mask.

Figure 4:
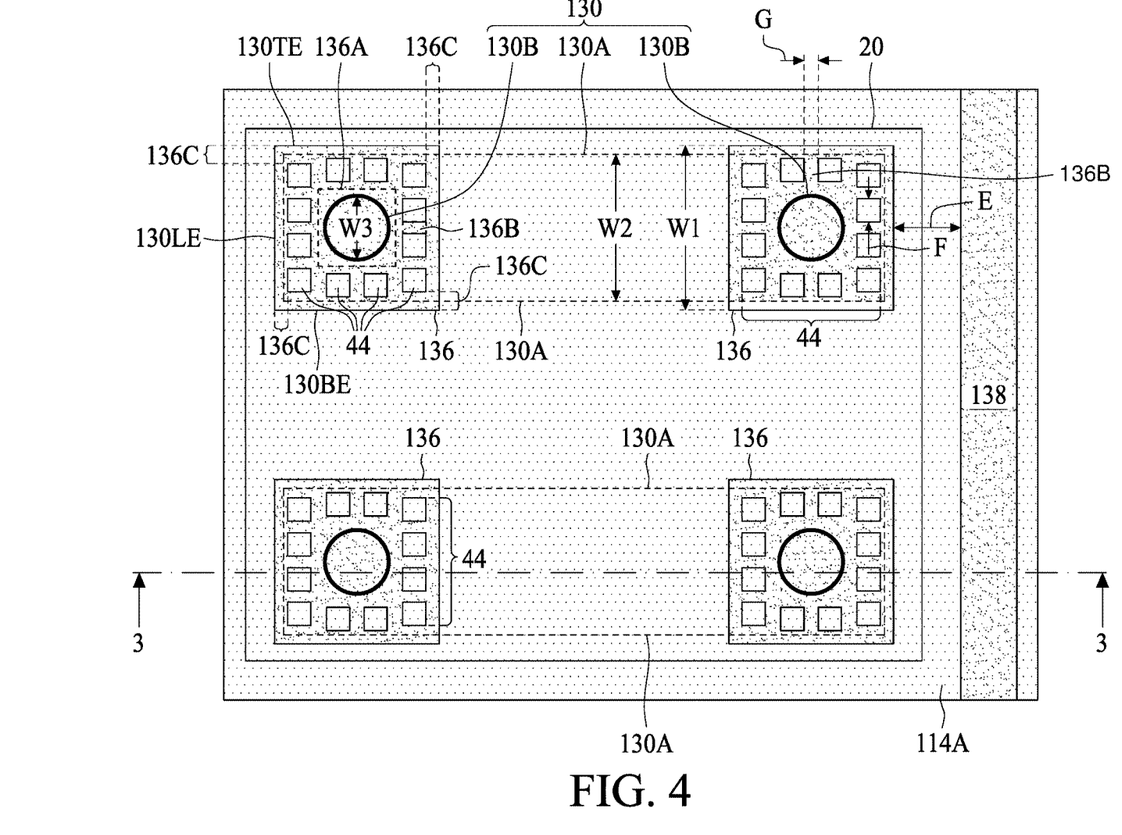
FIGS. 4 through 7 illustrate the top views of metal pads and UBMs for bonding an integrated passive device in accordance with some embodiments.
Figure 5:
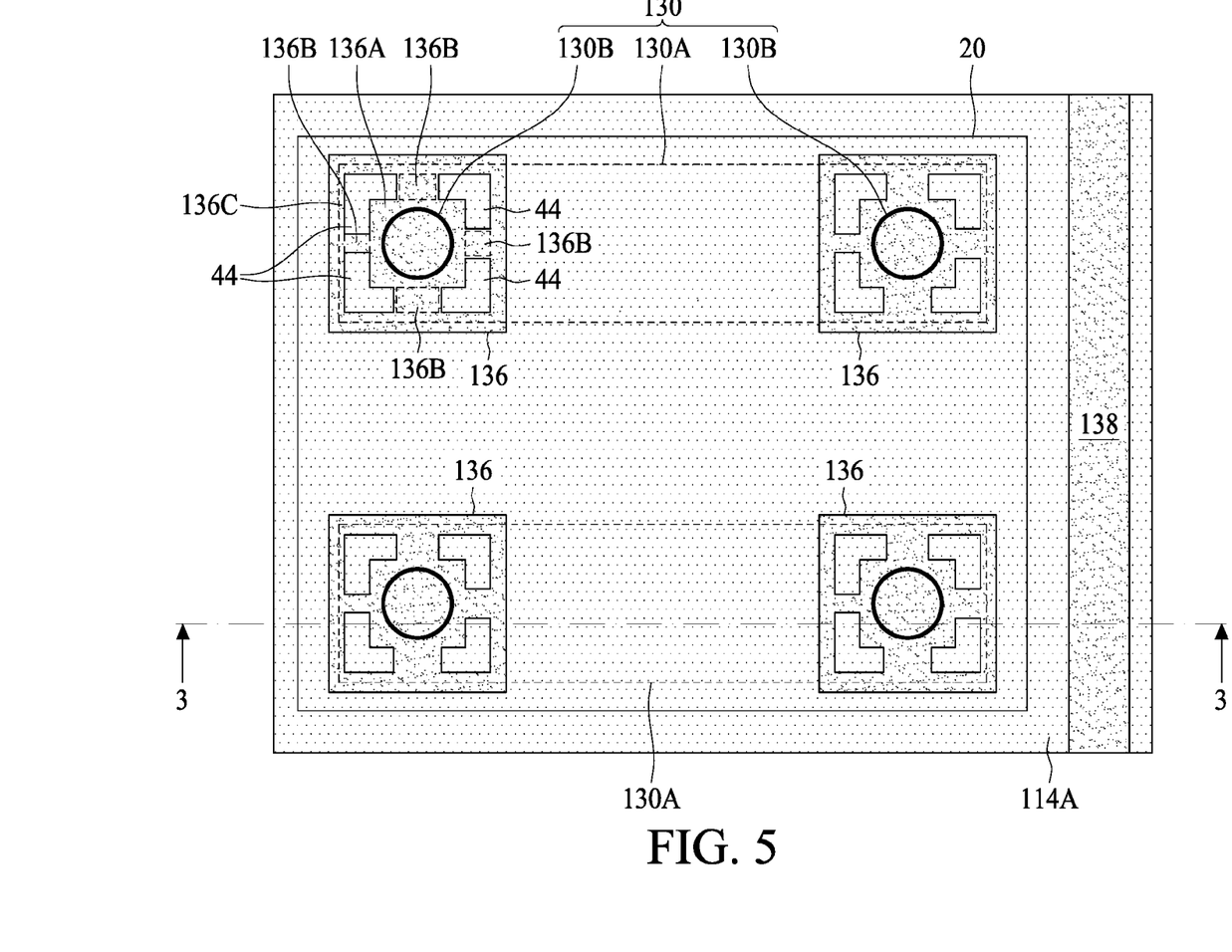

FIGS. 4 through 7 illustrate the top views of metal pads 136, UBMs 130, and IPD 20 in accordance with some exemplary embodiments. Exemplary cross-sectional views of FIGS. 4 and 5 are shown in FIG. 3, wherein the cross-sectional view is obtained from the plane containing line 3-3 in FIGS. 4 and 5. In FIGS. 4 through 7, although metal pads 136, UBMs 130, and IPD 20 are illustrated in the same top views, these features are actually in different levels (as shown in FIGS. 1 and 3), and hence are not present in the same horizontal plane.

Referring to FIG. 4, four metal pads 136 are formed. Each of the metal pads 136 is connected to a corresponding via portion 130B of one of UBMs 130, as also shown in FIG. 3. Each of UBMs 130 is connected to two metal pads 136. In accordance with some embodiments of the present disclosure, via portions 130B are connected to the opposite end portions of the respective UBM pad portions 130A. In the following discussion, one of metal pads 136 is discussed as an example, while the disclosure may be applied to other metal pads.

As shown in FIG. 4, a plurality of openings 44 (also illustrated in FIG. 3) is formed in metal pad 136. Openings 44 are filled with a dielectric material such as the material of dielectric layer 114A as shown in FIG. 3. The plurality of openings 44 may be aligned to a ring encircling an inner portion 136A of metal pad 136. In addition, metal pad 136 also includes an outer portion 136C outside of the ring of openings 44. There is a plurality of strips 136B (with one marked), which are parts of metal pad 136, between neighboring openings 44, wherein each of metal pad strips 136B interconnects inner portion 136A and outer portion 136C. In accordance with some embodiments, inner portion 136A is large enough for UBM via portion 130B to land on it.

The top-view shape of openings 44 may be rectangles, circles, hexagons, octagons, triangles, or any other shape. The top-view shape of UBM via portion 130B is illustrated as a circle, while any other shape such as a rectangle, a circle, a hexagon, an octagon, or a triangle may also be used.

In accordance with some exemplary embodiments, width W1 of metal pad 136 is greater than width W2 of UBM 130. Accordingly, metal pad 136 may extend beyond the edges of the respective overlying UBM 130. For example, the top-left metal pad 136 may extend upwardly beyond the top edge 130TE of UBM 130, downwardly beyond the bottom edge 130BE of UBM 130, and toward left beyond the left edge 130LE of UBM 130. Making metal pad 136 extending beyond the edges of UBMs 130 may advantageously help absorb the stress applied by IPD 20 and UBM 130. For example, referring back to FIG. 3, the bottom surface 130BS of UBM 130 contacts the top surface of dielectric layer 114A, and may impart a force (such as when during thermal cycles) to dielectric layer 114A. With a large metal pad 136 directly underlying UBM 130 and extending beyond the edges of UBM 130, the stress may be better absorbed. Particularly, allowing metal pad 136 to extend beyond three edges of the respective overlying UBM 130 may maximize the absorption of stress. On the other hand, a large metal pad 136 may cause the cracking of dielectric layer 114A, for example, at the positions illustrated as 46 in FIG. 3, which are along the edges of metal pad 136 and neighboring metal trace 138. In accordance with some embodiments of the present disclosure, forming openings 44 in metal pad 136 may reduce the stress caused by the large metal pad 136, and result in reduced possibility of cracking.

Referring back to FIG. 4, Width W2 of UBM 130 is greater than width W3 of UBM via portion 130B. In accordance with some exemplary embodiments, distance E between metal pad 136 and the closest neighboring metal trace 138 is greater than about 40 μm, so that the possibility of cracking in dielectric layer 114A is reduced. In accordance with some embodiments, length and width F of openings 44 are greater than about 10 µm, and width G of metal pad strips 136B is greater than about 10 µm. Widths F and G may also be equal to the smallest dimension that is achievable by the forming technology of metal pads 136. The ratio of the total area of all openings 44 in a metal pad 136 to the total area of the metal pad 136 (including the areas of openings 44) may be high to improve the reduction in stress.

FIG. 5 illustrates the top view of metal pads 136, UBMs 130, and IPD 20 in accordance with some exemplary embodiments. In accordance with some embodiments, openings 44 in metal pads 136 have L-shapes or other irregular shapes. Furthermore, in one of metal pads 136, the inner edges of openings 44 outline a rectangular inner portion 136A of metal pad 136. The outer edges of openings 44 outline the inner boundaries of outer portion 136C of metal pad 136. Metal pad strips 136B interconnect inner portion 136A and outer portion 136C. Via portions 130B of UBM 130 are in contact with the inner portion 136A of metal pads 136. In addition, in the top view, metal pads 136 also expand beyond the edges of the respective UBMs 130.

Figure 6:
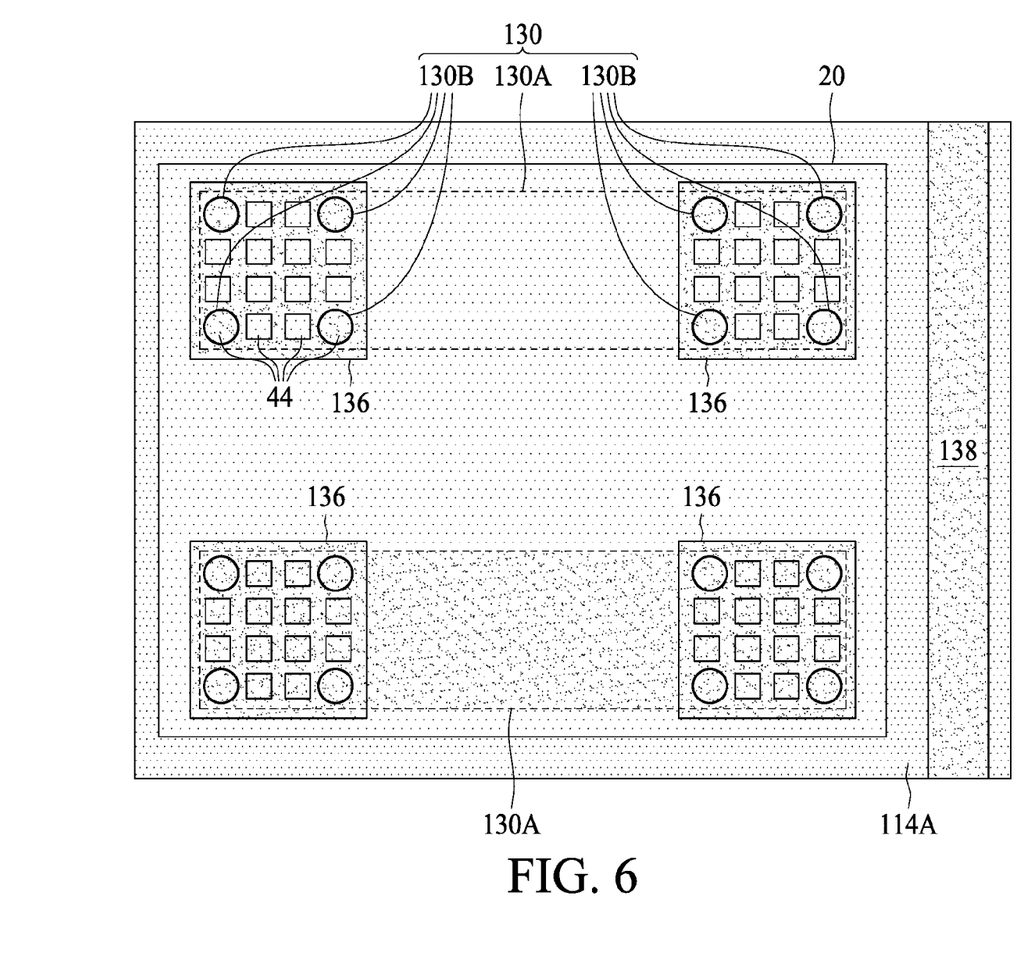

FIG. 6 illustrates the top view of metal pads 136, UBMs 130, and IPD 20 in accordance with some exemplary embodiments. In accordance with some embodiments, via portions 130B are made smaller than in the embodiments shown in FIGS. 4 and 5, and there are a plurality of via portions 130B connecting one metal pad 136 to the overlying UBM 130. Accordingly, with more via portions 130B, the total top-view area of all via portions 130B that contact the same metal pad 136 is large enough to conduct the required electrical current. On the other hand, the layout of openings 44 and via portions 130B is flexible. For example, as shown in FIG. 6, via portions 130B may contact the outer portions (or inner portions) of the respective metal pad 136. On the other hand, the plurality of openings 44 may be laid out as a repeated pattern such as an array to maximize the total area of openings 44, and to minimize the stress caused by large metal pads 136.

Figure 7:
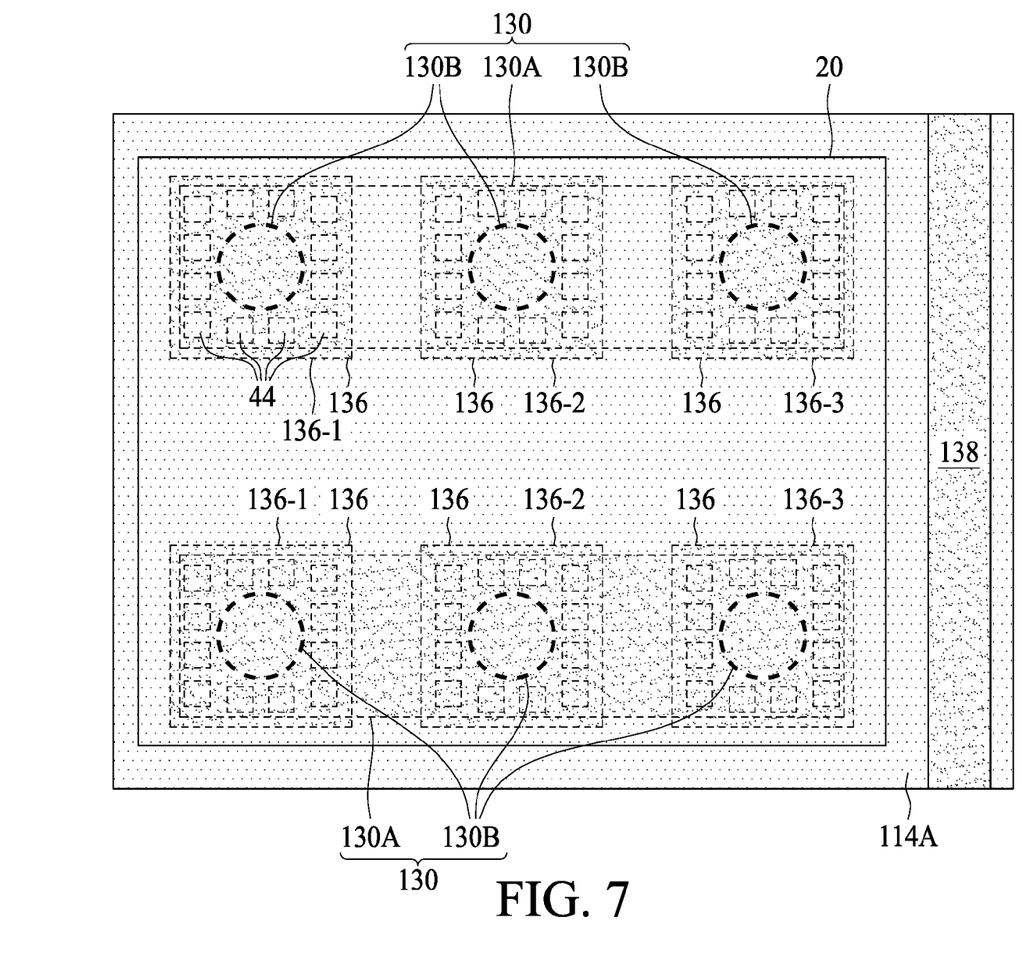

FIG. 7 illustrates the top view of metal pads 136, UBMs 130, and IPD 20 in accordance with some exemplary embodiments, in which there is a single metal pad 136 or more than two metal pads 136 are connected to the same UBM 130. In some exemplary embodiments, some or all the illustrated metal pads 136-1, 136-2, and 136-3 may be formed in any combination, providing there is at least one metal pad 136 connected to each of UBMs 130. Accordingly, metal pads 136 are illustrated using dashed lines to indicate that each of them may or may not be formed. In accordance with some exemplary embodiments, metal pads 136-2 are formed, while metal pads 136-1 and 136-3 are not formed. In accordance with alternative embodiments, all of metal pads 136-1, 136-2, and 136-3 are formed.

The embodiments of the present disclosure have some advantageous features. By enlarging the sizes of metal pads and making the metal pads to extend beyond the outer edges of the respective overlying UBMs, the stress caused by the IPD to the underlying dielectric layers and RDLs is better absorbed. Enlarging the sizes of metal pads, however, may result in the cracking of the dielectric layers during thermal cycles. In the embodiments of the present disclosure, this problem is solved by forming openings (slots) in the metal pads. Since the expansion of metal pads caused by the increase in the temperature is proportional to the linear dimension (length, width, and thickness) of the metal pads, by forming openings, the large metal pads are partially segregated by the openings as smaller portions, and the expansion of metal pads is reduced, resulting in reduced possibility of cracking.

In accordance with some embodiments of the present disclosure, a package includes a conductive pad, with a plurality of openings penetrating through the conductive pad. A dielectric layer encircles the conductive pad. The dielectric layer has portions filling the plurality of openings. An UBM includes a via portion extending into the dielectric layer to contact the conductive pad. A solder region is overlying and contacting the UBM. An integrated passive device is bonded to the UBM through the solder region.

In accordance with some embodiments of the present disclosure, a package includes a device die, a through-via, an encapsulating material encapsulating the device die and the through-via therein, and a plurality of redistribution lines over the encapsulating material and electrically coupled to the device die and the through-via. The plurality of redistribution lines includes a first metal pad and a second metal pad. The first metal pad has a plurality of through-openings. An integrated passive device has a first terminal and a second terminal, wherein the first terminal overlaps a portion of, and is electrically coupled to, the first metal pad and the second metal pad. A polymer layer includes portions extending into the plurality of through-openings.

In accordance with some embodiments of the present disclosure, a package includes a conductive pad, with a plurality of openings penetrating through the conductive pad, and a dielectric layer encircling the conductive pad. The dielectric layer includes portions filling the plurality of openings. An UBM has a via portion extending into the dielectric layer to contact the conductive pad, and a pad portion higher than the dielectric layer. The pad portion overlaps the plurality of openings. The conductive pad laterally extends beyond edges of the pad portion of the UBM. The package further includes a solder region over and contacting the UBM, and an integrated passive device, wherein the solder region bonds the UBM to the integrated passive device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first conductive pad, with a plurality of openings penetrating through the first conductive pad, wherein all portions of the first conductive pad are electrically inter-coupled;
   a dielectric layer encircling the first conductive pad, wherein the dielectric layer comprises portions filling the plurality of openings;
   a first Under-Bump Metallurgy (UBM) comprising a first via portion extending into the dielectric layer to contact the first conductive pad;
   a solder region over and contacting the first UBM; and
   an integrated passive device, wherein the solder region bonds the first UBM to the integrated passive device.

2. The package of claim 1 further comprising:
a plurality of redistribution lines underlying the first conductive pad;
an encapsulating material underlying the plurality of redistribution lines;
a through-via encapsulated in the encapsulating material; and
a device die encapsulated in the encapsulating material.

3. The package of claim 1, wherein the first conductive pad laterally extends beyond edges of the first UBM.

4. The package of claim 1, wherein the plurality of openings is aligned to a ring, with the first conductive pad having an outer portion outside of the ring, and an inner portion inside the ring, and the first via portion has a bottom surface contacting a top surface of the inner portion of the first conductive pad.

5. The package of claim 1, wherein the first UBM comprises a plurality of via portions contacting the first conductive pad, with the first via portion being one of the plurality of via portions.

6. The package of claim 1, wherein the plurality of openings extends from a top surface of the first conductive pad to a bottom surface of the first conductive pad.

7. The package of claim 1 further comprising a second conductive pad, with an additional plurality of openings penetrating through the second conductive pad, and wherein the dielectric layer extends into the additional plurality of openings.

8. The package of claim 7, wherein the first UBM further comprises a second via portion, with the second conductive pad contacting a bottom surface of the second via portion.

9. The package of claim 1, wherein the integrated passive device comprises a first terminal and a second terminal, with the first UBM connected to the first terminal, and the package further comprises a second UBM connected to the second terminal.

10. The package of claim 1, wherein the integrated passive device comprises a capacitor.

* * * * *